(12) United States Patent  
Sekine et al.

(10) Patent No.: US 11,908,827 B2  
(45) Date of Patent: Feb. 20, 2024

(54) WIRE BONDING APPARATUS

(71) Applicant: SHINKAWA LTD., Tokyo (JP)

(72) Inventors: Naoki Sekine, Tokyo (JP); Yasuo Nagashima, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 144 days.

(21) Appl. No.: 17/435,041

(22) PCT Filed: Mar. 4, 2020

(86) PCT No.: PCT/JP2020/009196  
§ 371 (c)(1),  
(2) Date: Aug. 31, 2021

(87) PCT Pub. No.: WO2020/184338  
PCT Pub. Date: Sep. 17, 2020

(65) Prior Publication Data  
US 2022/0149001 A1  May 12, 2022

(30) Foreign Application Priority Data

Mar. 8, 2019 (JP) .................... 2019-042372

(51) Int. Cl.  
*B23K 20/00* (2006.01)  
*H01L 23/00* (2006.01)  
*B23K 101/40* (2006.01)

(52) U.S. Cl.  
CPC ............ *H01L 24/78* (2013.01); *B23K 20/005* (2013.01); *B23K 2101/40* (2018.08);  
(Continued)

(58) Field of Classification Search  
CPC .... B23K 20/007; B23K 20/005; B23K 20/10; B23K 20/26; H01L 24/78; H01L 2224/85205; H01L 2224/78301  
See application file for complete search history.

(56) References Cited

U.S. PATENT DOCUMENTS 4,422,568 A     12/1983  Elles et al.  
9,793,236 B2 *  10/2017  Sekine ............... B23K 20/005  
(Continued)

FOREIGN PATENT DOCUMENTS

JP      S50103276      8/1975  
JP      S589332        1/1983  
(Continued)

OTHER PUBLICATIONS

"International Search Report (Form PCT/ISA/210) of PCT/JP2020/009196," dated Jun. 2, 2020, with English translation thereof, pp. 1-4.

*Primary Examiner* — Erin B Saad  
(74) *Attorney, Agent, or Firm* — JCIPRNET

(57) ABSTRACT

A wire bonding apparatus connecting a lead of a mounted member with an electrode of a semiconductor die through a wire comprises a capillary through which the wire is inserted, a shape acquisition part which acquires the shape of the lead to which the wire is connected, a calculating part which calculates an extending direction of a wire tail extending from the end of the capillary based on the shape of a lead to which the wire is connected next, and a cutting part which moves the capillary in the extending direction and cuts the wire to form the wire tail after the lead is connected with the electrode through the wire. Thus, in the wire bonding using wedge bonding, joining part tails (183a, 283a, 383a) formed in continuation to a first bonding point can be prevented from coming into contact with each other.

6 Claims, 13 Drawing Sheets

(52) U.S. Cl.
   CPC ............... *H01L 2224/7855* (2013.01); *H01L 2224/78611* (2013.01); *H01L 2224/78824* (2013.01); *H01L 2224/78901* (2013.01)

(56) References Cited

U.S. PATENT DOCUMENTS

| | | |
|---|---|---|
| 2005/0167473 A1 | 8/2005 | Mayer et al. |
| 2011/0114704 A1* | 5/2011 | Sugawara ............... H01L 24/03 228/9 |
| 2012/0055976 A1* | 3/2012 | Akiyama ............ B23K 20/007 228/104 |
| 2014/0138426 A1 | 5/2014 | Hagiwara et al. |
| 2015/0243627 A1* | 8/2015 | Akiyama ............... H01L 24/85 228/102 |
| 2015/0249063 A1* | 9/2015 | Sekine ................ B23K 20/005 228/4.5 |
| 2016/0163673 A1 | 6/2016 | Hagiwara et al. |
| 2018/0090464 A1* | 3/2018 | Hayata .................. B23K 20/26 |

FOREIGN PATENT DOCUMENTS

| | | |
|---|---|---|
| JP | 2012256861 | 12/2012 |
| WO | 2012157599 | 11/2012 |

\* cited by examiner

WIRE BONDING APPARATUS

CROSS-REFERENCE TO RELATED APPLICATION

This application is a 371 application of the International PCT application serial no. PCT/JP2020/009196, filed on Mar. 4, 2020, which claims the priority benefits of Japan Patent Application No. 2019-042372, filed on Mar. 8, 2019. The entirety of each of the above-mentioned patent applications is hereby incorporated by reference herein and made a part of this specification.

BACKGROUND

Technical Field

The present invention relates to an apparatus which performs wire bonding of a wedge bonding method using a capillary.

Related Art

A wire bonding apparatus is used, for example, for connecting between a lead of a substrate and a pad of a semiconductor chip through a thin wire. Wire bonding is performed as follows. That is, the wire is lowered together with a bonding tool for wire bonding (hereinafter also called tool) toward the lead. Then, the wire is pressed to the lead by the front end of the tool, an ultrasonic vibration is applied and the wire and the lead are joined to perform first bond (1st bond). After the first bond, the tool is pulled up to extend the wire, form a proper loop and moves the wire to the upper side of the pad. When the wire comes to the upper side of the pad, the tool is lowered. Then, the wire is pressed to the pad by the front end of the tool, ultrasonic vibration is applied and the wire and the pad are joined to perform second bond (2nd bond). After the second bond, the movement of the wire is halted through a clamper and the tool is pulled up to cut the wire at a second bond point. The connection between a plurality of leads of the substrate and a plurality of pads of the semiconductor chip is performed by repeating the above operation.

Meanwhile, as a method of wire bonding, ball bonding and wedge bonding are known. In ball bonding, a gold wire and so on which can form a free air ball (FAB) through a high-voltage spark and so on is used, and a capillary which has a chamfer part rotationally symmetric around a longitudinal axis at the front end is used as the tool.

In wedge bonding, instead of using a wire of aluminum and so on to form a FAB and using a capillary as the tool for bonding, a tool for wedge bonding which has a wire guide and a pressing surface at the front end is used as the tool for bonding. In wedge bonding, at the front end of the tool, the wire is pulled out to the pressing surface side diagonally along the wire guide, and the side surface of the wire is pressed to the bonding object to perform bonding on the pressing surface. Thus, at the front end of the tool, the wire becomes horizontal from the pressing surface, and the front end of the tool does not become rotationally symmetric around the longitudinal axis (for example, see patent literature 1).

Because the front end of the tool for wedge bonding does not become rotationally symmetric, depending on the arrangement of the pad and the lead, the direction of the wire guide may not match the connecting direction of the wire directly. Therefore, a rotary bonding head holding the tool is used, or a bonding stage holding the bonding object is rotated. Therefore, a method is put forth in which a capillary having a rotationally symmetric front end is used, and the side surface of the wire is pressed and joined by the front end of the capillary (for example, see patent literature 2, 3).

In patent literature 3, a method is described in which wedge bonding is performed by a tool (capillary) having a rotationally symmetric front end and a flat bottom surface of the front end (the pressing surface of the wire). In the wedge bonding method of patent literature 3, after the bonding to the second bonding point, the clamper is opened, the tool is raised and moved along a straight line from the next first bond point toward the next second bond point (the next wire direction), and the wire is cut in a state that the wire (wire tail) along the next wire direction is extended at the front end of the tool. According to this method, because the wire tail can be bent toward the next wire direction at the front end of the tool, during the next bonding, a bent portion of the wire is pressed by the front end of the tool, and thereby wedge bonding can be performed without rotating the bonding head.

LITERATURE OF RELATED ART

Patent Literature

Patent Literature 1: Japanese Patent Laid-Open No. 58-9332

Patent Literature 2: U.S. Patent Application Laid-Open No. 2005/0167473

Patent Literature 3: Japanese Patent Laid-Open No. 2012-256861

SUMMARY

Problems to be Solved

FIG. 10 is a diagram showing an example in which a wire 1084 is first bonded to a lead 1074 of a substrate and second bonded to a pad 1073 of a semiconductor chip 1072 through a wedge bonding method of patent literature 3. As shown in FIG. 10, when a capillary is used in the wedge bonding, in continuation to a joining part 1083 which is a first bonding point, a long joining part tail 1083a (also called wire tail) extending along the direction of the wire 1084 is formed. In addition, in FIG. 10, in order to promote understanding, each of the joining part tails 1083a is drawn a little longer. In recent years, the distance between adjacent leads 1074 becomes narrow and the wire direction of the wire 1084 changes greatly. Therefore, as shown in the inner side of a broken line in FIG. 10, the joining part tail 1083a extending along the direction of the wire 1084 may protrude from the lead 1074. Thus, there is concern that the adjacent joining part tails 1083a contact (short) with each other.

The purpose of the present invention is to prevent the contact of joining part tails formed in continuation to a first bonding point with each other in a wire bonding apparatus in which a capillary is used as a bonding tool and a wire is first bonded to a lead of a mounted member (substrate and so on) and second bonded to a pad (electrode) of a semiconductor chip through wedge bonding.

Means to Solve the Problems

The wire bonding apparatus of the present invention is a wire bonding apparatus connecting the lead of the mounted member with the electrode of a semiconductor die through the wire and includes: a capillary through which the wire is inserted; a shape acquisition part which acquires the shape of a lead to which the wire is connected; a calculating part which calculates the extending direction of the wire tail extending from the end of the capillary based on the shape of a lead to which the wire is connected next; and a cutting part which moves the capillary in the extending direction and cuts the wire to form the wire tail after the lead is connected with the electrode through the wire.

In the wire bonding apparatus of the present invention, the extending direction of the wire tail may be a tail extending direction, and the shape acquisition part may recognize a lead direction which is a direction in which a section connected with the wire on the lead to which the wire is connected next extends, and the cutting part may form the wire tail in a manner that the tail extending direction becomes the same direction as the lead direction.

In the wire bonding apparatus of the present invention, the extending direction of the wire tail may be a tail extending direction, and the wire bonding apparatus may further comprise a bending station which has a step part catching the wire tail extending from a front end of the capillary, and a bending part which moves the capillary to the bending station and bends the wire tail in the tail extending direction after arranging the wire tail to a position along the step part.

In the wire bonding apparatus of the present invention, a first angle, which is an angle formed by the direction of the wire connecting the lead with the electrode and the lead direction which is a direction in which a section connected with the wire on the lead to which the wire is connected next extends, may be acquired; when the first angle is smaller than a predetermined angle, the wire tail may be formed through the cutting part, and when the first angle is equal to or greater than the predetermined angle, the wire tail may be formed through the bending part.

In the wire bonding apparatus of the present invention, the calculating part may be a first calculating part, and the cutting part may be a first cutting part, and the extending direction of the wire tail may be a first tail extending direction. The wire bonding apparatus may further include a second calculating part, which calculates a direction of a straight line connecting the lead to which the wire is connected next and the electrode, as a second tail extending direction which is the extending direction of the wire tail extending from the end of the capillary, and a second cutting part, which moves the capillary in the second tail extending direction and cuts the wire to form the wire tail after the lead is connected with the electrode through the wire.

In the wire bonding apparatus of the present invention, a first length which combines a joining part formed on the lead and a joining part tail protruding from the joining part may be acquired; when the first length becomes longer than a minimum distance between the leads of the mounted member, the wire tail may be formed through the first cutting part, and when the first length is equal to or shorter than the minimum distance, the wire tail may be formed through the second cutting part.

Effect

According to the present invention, based on the shape of the next lead of the mounted member, the extending direction of the wire tail extending from the end of the capillary is calculated, and after the lead is connected with the electrode through the wire, the capillary is moved in the extending direction and the wire is cut to form the wire tail. Therefore, when the wire is connected (joined) to the next lead, a joining part tail taking the shape of the next lead into consideration is formed on the lead, and thus each of the joining part tails is prevented from protruding from each of the leads of the mounted member. Therefore, the contact of the joining part tails of the adjacent leads with each other is prevented.

DESCRIPTION OF THE EMBODIMENTS

Figure 1:
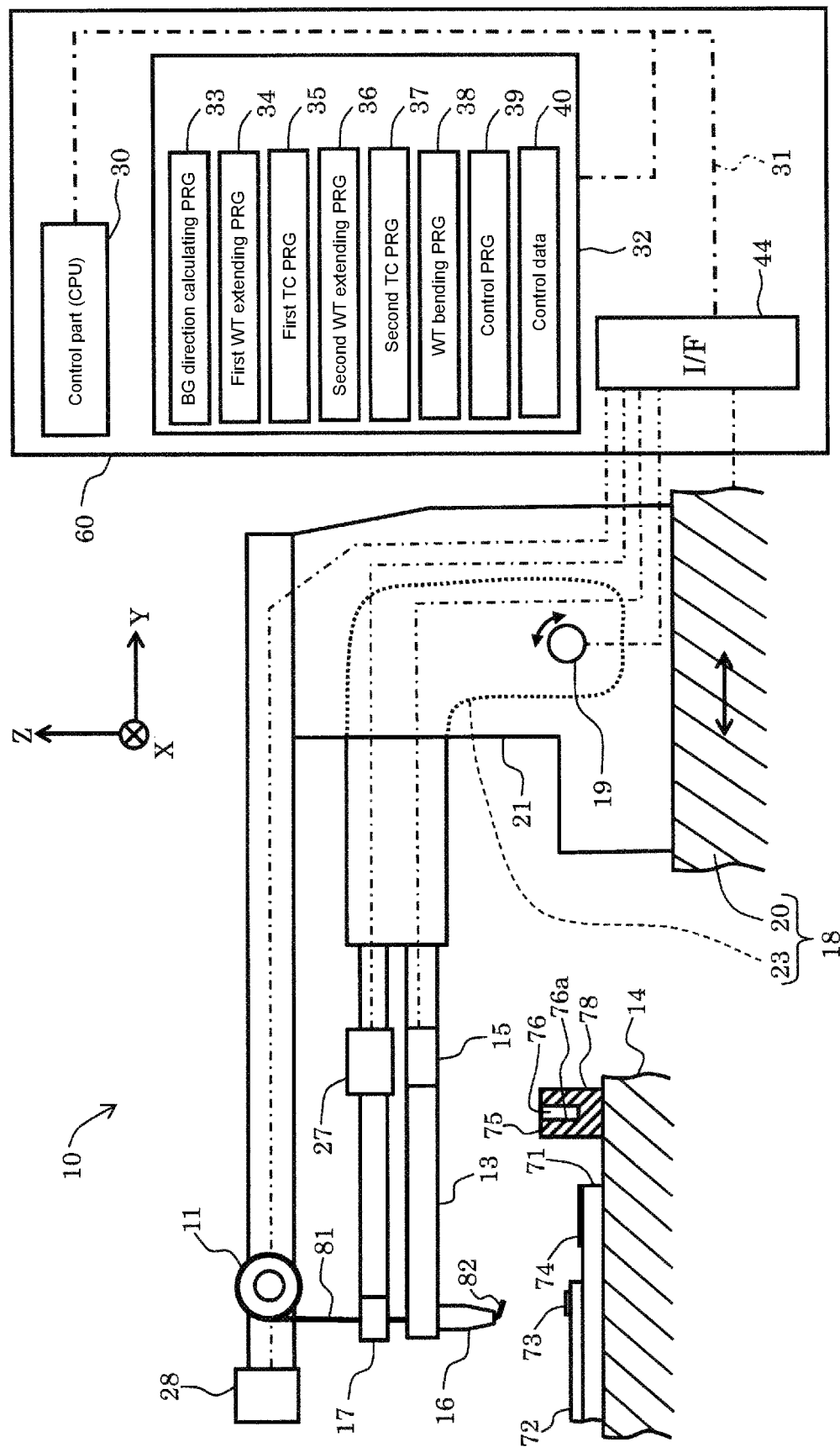
FIG. 1 is a system diagram showing the structure of a wire bonding apparatus of an embodiment of the present invention.

Hereinafter, an embodiment of the present invention is described referring to the drawings. The shape, the arrangement, the material and so on of each member mentioned below are exemplified for description, and may be altered appropriately in accordance with the specification and the like of a wire bonding apparatus or a semiconductor device made through the wire bonding apparatus. In all diagrams, similar elements are marked with the same sign, and repeated descriptions are omitted.

FIG. 1 is a system diagram showing the structure of a wire bonding apparatus 10. In FIG. 1, signal lines are shown as dashed lines. The wire bonding apparatus 10 is an apparatus that uses a capillary 16 as a bonding tool, uses a wire of aluminum as a wire 81, and connects two bonding objects through the wire 81 by wedge bonding. In FIG. 1, a semiconductor chip 72 and a substrate 71 which are the bonding objects are shown, although they are not the constituent elements of the wire bonding apparatus 10. In addition, in the embodiment, wedge bonding is the bonding that is performed using ultrasonic wave and pressure, without forming a FAB at the front end of the wire.

The wire bonding apparatus 10 includes a bonding stage 14, an XY stage 20, and a computer 60. The bonding stage 14 is a bonding object holding table that loads the semiconductor chip 72 and the substrate 71 which are the two bonding objects, and attracts and fixes the under surface of the substrate 71.

The semiconductor chip 72 is the chip that integrates transistors and the like on a silicon substrate and forms an electronic circuit, and an input terminal and an output terminal serving as an electronic circuit are led out as a plurality of pads 73 (also called electrode, a pad 73 is shown in FIG. 1) to the upper surface of the semiconductor chip 72.

The substrate 71 is a substrate in which the pattern of a desired wiring is formed on an epoxy resin substrate, and has a chip pad fixing the under surface of the semiconductor chip 72 (not shown), a plurality of leads 74 arranged around the semiconductor chip 72 (one lead 74 is shown in FIG. 1), the input terminal and the output terminal serving as the substrate which is led out from the chip pad or the plurality of leads 74. The wire bonding is performed by connecting the lead 74 of the substrate 71 and the pad 73 of the semiconductor chip 72 by the wire 81. In addition, the member on which the semiconductor chip 72 is mounted (mounted member) is, for example, a lead frame, apart from the substrate 71. When the mounted member is a lead frame, the lead of the lead frame and the pad 73 of the semiconductor chip 72 are connected by the wire 81 by wire bonding.

On the upper surface of the bonding stage 14, a bending station 78 for bending the wire (wire tail 82) extending from the front end of the capillary 16 is arranged. The bending station 78 is a columnar member and has an upper surface 75 and a hole 76 formed substantially at the center of the upper surface 75. The diameter of the hole 76 becomes larger than the diameter of the wire 81, and an inner surface 76a of the hole 76 is a cylindrical surface. The upper surface 75 of the bending station 78 is a plane, and the upper surface 75 and the inner surface 76a of the hole 76 constitute a step part.

The XY stage 20 is a moving table that loads a bonding head 21 and moves the bonding head 21 to a desired position in an XY plane relative to the bonding stage 14. The XY plane is a plane parallel to the upper surface of the bonding stage 14. The Y direction is a direction parallel to a longitudinal direction of an ultrasonic transducer 13 described later. In FIG. 1, Z direction, which is the direction perpendicular to the X direction, the Y direction, and the XY plane, is shown.

The bonding head 21 is fixed and loaded on the XY stage 20, and incorporates a Z-direction motor 19. A Z driving arm 23 pivots through the rotation control of the Z-direction motor 19. On the Z driving arm 23, the ultrasonic transducer 13 and a clamper 17 are installed. The Z driving arm 23 is a member that may pivot around a pivot center (for example, an output shaft of the Z-direction motor 19) arranged on the bonding head 21 through the rotation control of the Z-direction motor 19. Due to the pivoting of the Z driving arm 23, the capillary 16 moves in the Z direction through the ultrasonic transducer 13. In addition, it is not necessary to take the output shaft of the Z-direction motor 19 as the pivot center arranged on the bonding head 21, and the pivot center is set to a position where the rotational load is reduced in consideration of the gravity position of the whole including the Z driving arm 23, the ultrasonic transducer 13, the clamper 17 and so on. The XY stage 20 and the Z driving arm 23 constitute a moving mechanism 18.

The ultrasonic transducer 13 is an elongated stick-like member in which a root part is installed on the Z driving arm 23 and the capillary 16 through which the wire 81 is inserted is installed on the front end part. An ultrasonic oscillator 15 is installed on the ultrasonic transducer 13, and the ultrasonic energy generated by driving the ultrasonic oscillator 15 is transferred to the capillary 16. Thus, the ultrasonic transducer 13 forms a shape of horn that becomes more tapered when getting closer to the front end side, in order to be capable of transferring the ultrasonic energy from the ultrasonic oscillator 15 to the capillary 16 efficiently.

Figure 2A:
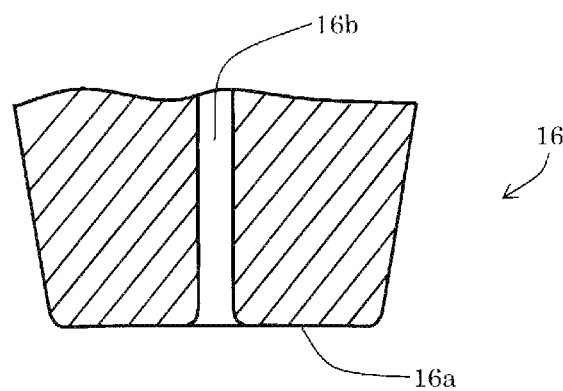
FIG. 2A is a sectional side view of a front end part of a capillary of the wire bonding apparatus of the embodiment of the present invention.
Figure 2B:
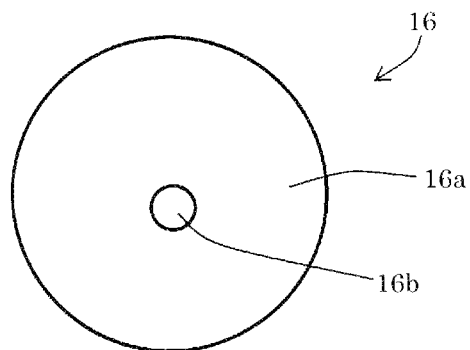
FIG. 2B is a bottom view of the front end part of the capillary of the wire bonding apparatus of the embodiment of the present invention.

FIG. 2A is a sectional side view of the front end part of the capillary 16, and FIG. 2B is a bottom view of the front end part of the capillary 16. The capillary 16 is a bonding tool which is a stick-like body and has a through-hole 16b extending in the longitudinal direction in which the wire is inserted, and a pressing surface 16a which is arranged on the rim of the through-hole 16b at the front end and presses the wire to the bonding object. As the capillary 16, a ceramic capillary used for ball bonding can be used directly. The capillary used for ball bonding is provided with a proper corner shape called chamfer on a front end face side of the through-hole in order to hold the FAB easily, but in the wedge bonding of the embodiment, the capillary used for ball bonding is used, and the pressing surface 16a which is a plane is included on the under surface on the front end face side of the through-hole of the capillary.

The tool for wedge bonding has, on the front end part, a wire guide diagonally arranged relative to the longitudinal direction and a pressing surface for pressing the side surface of the wire, and thus the wire is not rotationally symmetric around a longitudinal axis of the tool but has directionality along the direction of the wire guide and projects out in a lateral direction. When the above tool for wedge bonding is used, depending on the arrangement of the lead and the pad, the direction of the wire guide may not match the connecting direction of the wire directly.

For example, when the semiconductor chip 72 is loaded on a central part of the substrate 71, a plurality of pads 73 are arranged so as to go round along a peripheral part of the semiconductor chip 72, and a plurality of leads 74 are arranged on the substrate 71 so as to go round along the outside of the semiconductor chip 72, the connecting directions of the wire connecting the lead 74 with the pad 73 are different depending on each of a plurality of wire bondings. In order to match the direction of the wire guide to the connecting direction of the wire, it is necessary to rotate the tool for wedge bonding around the longitudinal axis or rotate the substrate 71.

In contrast, because the pressing surface 16a at the front end of the capillary 16 has a shape rotationally symmetric around the longitudinal axis of the capillary 16, even if the connecting directions of the wire connecting the lead 74 with the pad 73 are different for each wire bonding, only a shaping treatment that slightly changes the direction of the wire tail 82 protruding from the front end of the capillary 16 is required. For this reason, the capillary 16 is used for the wedge bonding.

Figure 5A:
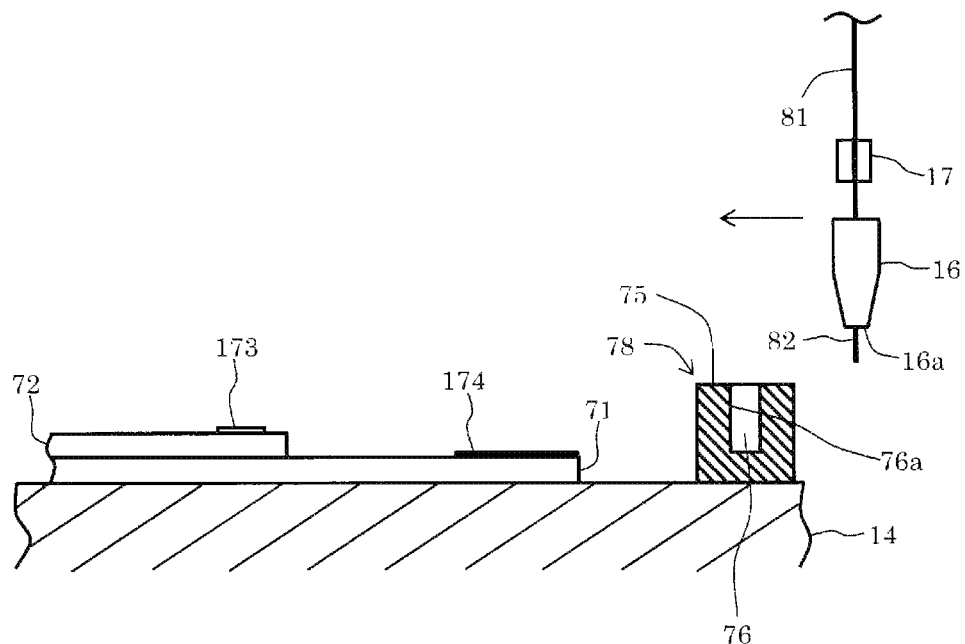
FIG. 5A is an explanatory diagram showing a wire bending operation of the wire bonding apparatus of the embodiment of the present invention.
Figure 5B:
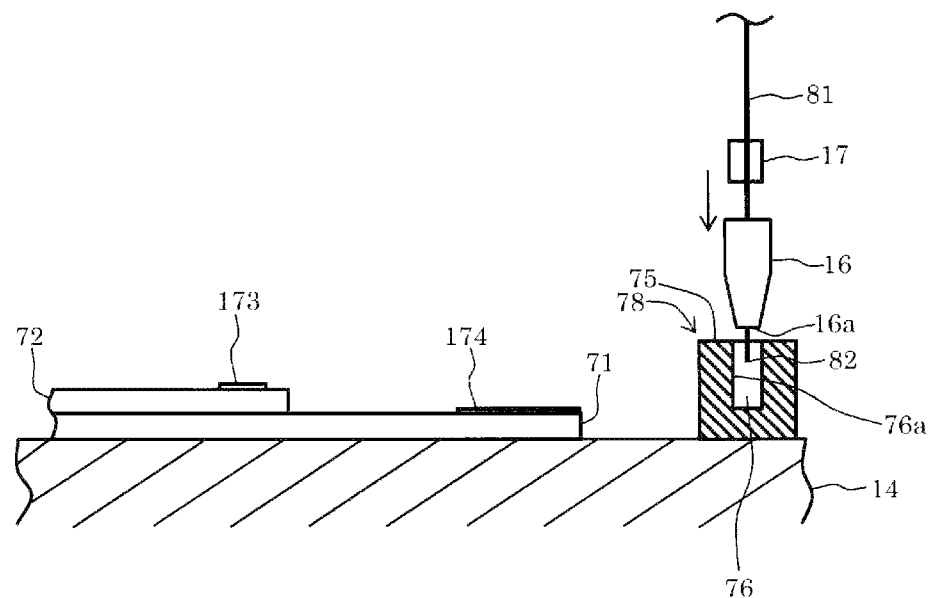
FIG. 5B is an explanatory diagram showing the wire bending operation of the wire bonding apparatus of the embodiment of the present invention.
Figure 5C:
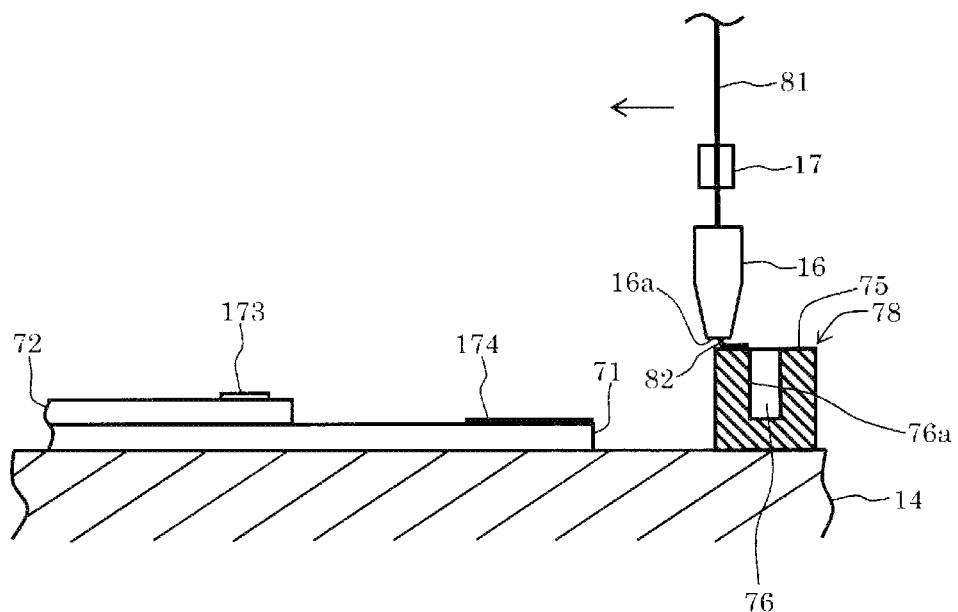
FIG. 5C is an explanatory diagram showing the wire bending operation of the wire bonding apparatus of the embodiment of the present invention.
Figure 5D:
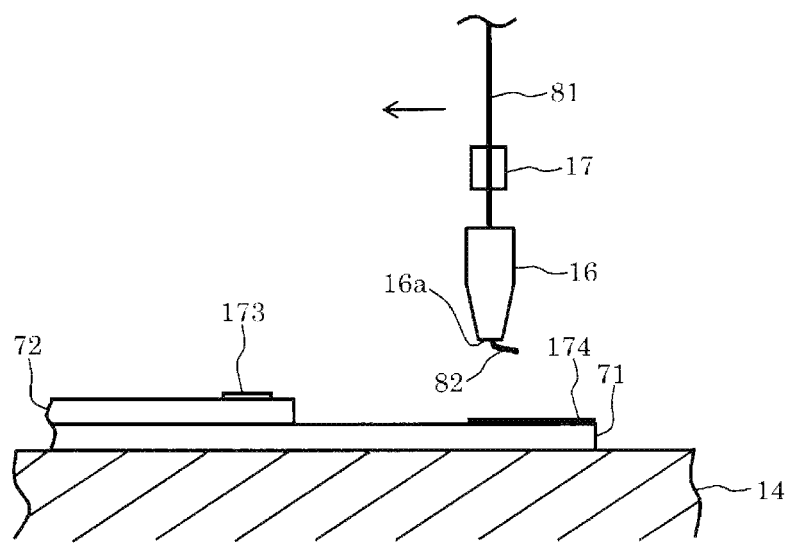
FIG. 5D is an explanatory diagram showing a wedge bonding operation to the lead of the substrate performed by the wire bonding apparatus of the embodiment of the present invention.
Figure 10:
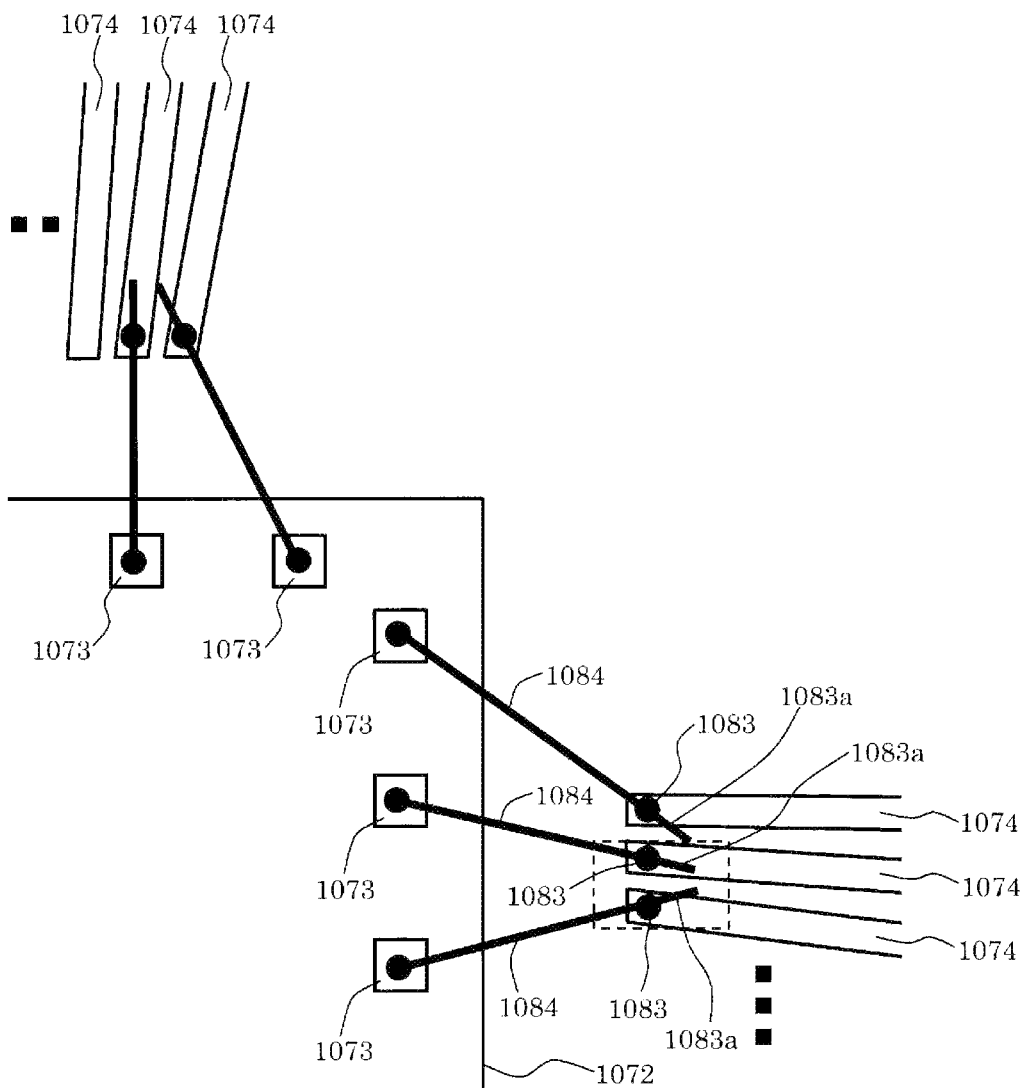
FIG. 10 is a diagram showing an example of the wire connecting the pad of the semiconductor chip with the lead of the substrate of the wire bonding apparatus of the related art after wedge bonding.

Meanwhile, when the capillary 16 is used for the wedge bonding, as shown in FIG. 10, during first bond performed on a pad 1073 or a lead 1074 (an example of the first bonding performed on the lead 1074 is shown in FIG. 10), a long joining part tail 1083a (wire tail) is formed in continuation to a first bonding point 1083 (joining part). The reason is that, as shown in FIG. 5D, the first bond is performed in a state that the wire tail 82 bending and protruding from the front end of the capillary 16 sticks out slightly outward of an outer peripheral end of the pressing surface 16a of the capillary 16. As described later in detail, the wire bonding apparatus 10 of the embodiment performs the bonding in order to prevent the adjacent long joining part tails 1083a shorting with each other.

Back to FIG. 1, the wire 81 which is inserted into the capillary 16 is a thin line of aluminum. The wire 81 is wound around a wire spool 11 arranged on a wire holder extending from the bonding head 21, and is inserted into the through-hole 16b (see FIG. 2A) of a central part of the capillary 16 from the wire spool 11 through the clamper 17 to protrude from the front end of the capillary 16. As a material of the wire 81, in addition to a thin line of pure aluminum, a thin line with silicon, magnesium and so on properly mixed therein can be used. The diameter of the wire 81 can be selected depending on the bonding object. An example of the diameter of the wire 81 may be 30 μm.

The clamper 17 is installed on the Z driving arm 23 and includes a pair of nipping plates arranged on both sides of the wire 81. The clamper 17 makes the wire 81 into a state of moving freely by opening the nipping plates facing each other, and stops the movement of the wire 81 by closing the nipping plates facing each other. The clamper 17 can move with the capillary 16 and clamp the wire 81 appropriately because the clamper 17 is installed on the Z driving arm 23. The opening and closing of the clamper 17 is performed depending on the actuation of a clamper opening/closing mechanism 27.

The wire bonding apparatus 10 includes a camera 28 which is an imaging part acquiring images of the semiconductor chip 72, the substrate 71 and so on. The camera 28 captures images of the bonding object during the bonding, and alignment of the capillary 16 in an XY direction is performed based on the images captured. In addition, before the bonding is started, the camera 28 captures images of the bonding object, and thereby position data of each of the leads 74 of the substrate 71 in the XY direction, position data of each of the pads 73 of the semiconductor chip 72 in the XY direction, and the data of width, length, and inclination (extending direction) of each of the leads 74 of the substrate 71 is acquired. These data is stored in a storage part 32 as a part of control data 40. In addition, the acquisition of the data before the start of the bonding may be only performed on the leading semiconductor device when, for example, the semiconductor devices of the same specification (the semiconductor device in which the semiconductor chip 72 and the substrate 71 are bonded by wire) are made in succession.

Here, the acquisition of the data is described a little more specifically. A control part 30 functions as a shape acquisition part by reading a program from the storage part 32 and running the program. The shape acquisition part uses the camera 28 to acquire the shape of the lead 74 to which the wire 81 is connected and stores the shape in the storage part 32. It is preferable that the shape acquisition part recognizes the lead direction which is a direction in which a section of the lead 74 connected with the wire 81 extends, and stores the direction in the storage part 32. In addition, the shape acquisition part may recognize the lead directions of all of the leads 74 of the substrate 71 before the start of the bonding, or may recognize the lead direction of the lead 74 to which the wire 81 is connected next at the timing when each of the leads 74 is bonded.

Back to the description of the structure shown in FIG. 1, the computer 60 controls the operation of the elements of the wire bonding apparatus 10 as a whole. The computer 60 includes the control part 30 which has a CPU, an interface circuit 44, and the storage part 32. These parts are connected with each other through a data bus 31.

The interface circuit 44 is a drive circuit or a buffer circuit arranged between the control part 30 and each of the elements of the wire bonding apparatus 10. In the specification, the interface circuit is also called I/F. The interface circuit 44 includes an XY stage I/F connected to the XY stage 20, a Z-direction motor I/F connected to the Z-direction motor 19, an ultrasonic oscillator I/F connected to the ultrasonic oscillator 15, a clamper opening/closing mechanism I/F connected to the clamper opening/closing mechanism 27, a camera I/F connected to the camera 28 and so on.

The storage part 32 is a storage device that stores various types of programs and the control data. The various types of programs are a bonding direction calculating program 33, a first wire tail extending program 34, a first tail cut program 35, a second wire tail extending program 36, a second tail cut program 37, a wire tail bending program 38, and a control program 39 concerning other control treatments. The control data 40 is data and so on required for running the various types of programs.

The control part 30 reads each of the bonding direction calculating program 33, the first wire tail extending program 34, the first tail cut program 35, the second wire tail extending program 36, the second tail cut program 37, and the wire tail bending program 38 from the storage part 32 and runs the program to thereby function as a bonding direction calculating part, a first wire tail extending part, a first tail cutting part (also called first cutting part, or just called cutting part), a second wire tail extending part, a second tail cutting part (also called second cutting part), a wire tail bending part (also just called bending part). In addition, the second wire tail extending program 36 and the second tail cut program 37 are programs used in lieu of the first wire tail extending program 34 and the first tail cut program 35 and are not used in an original embodiment described below.

Figure 3:
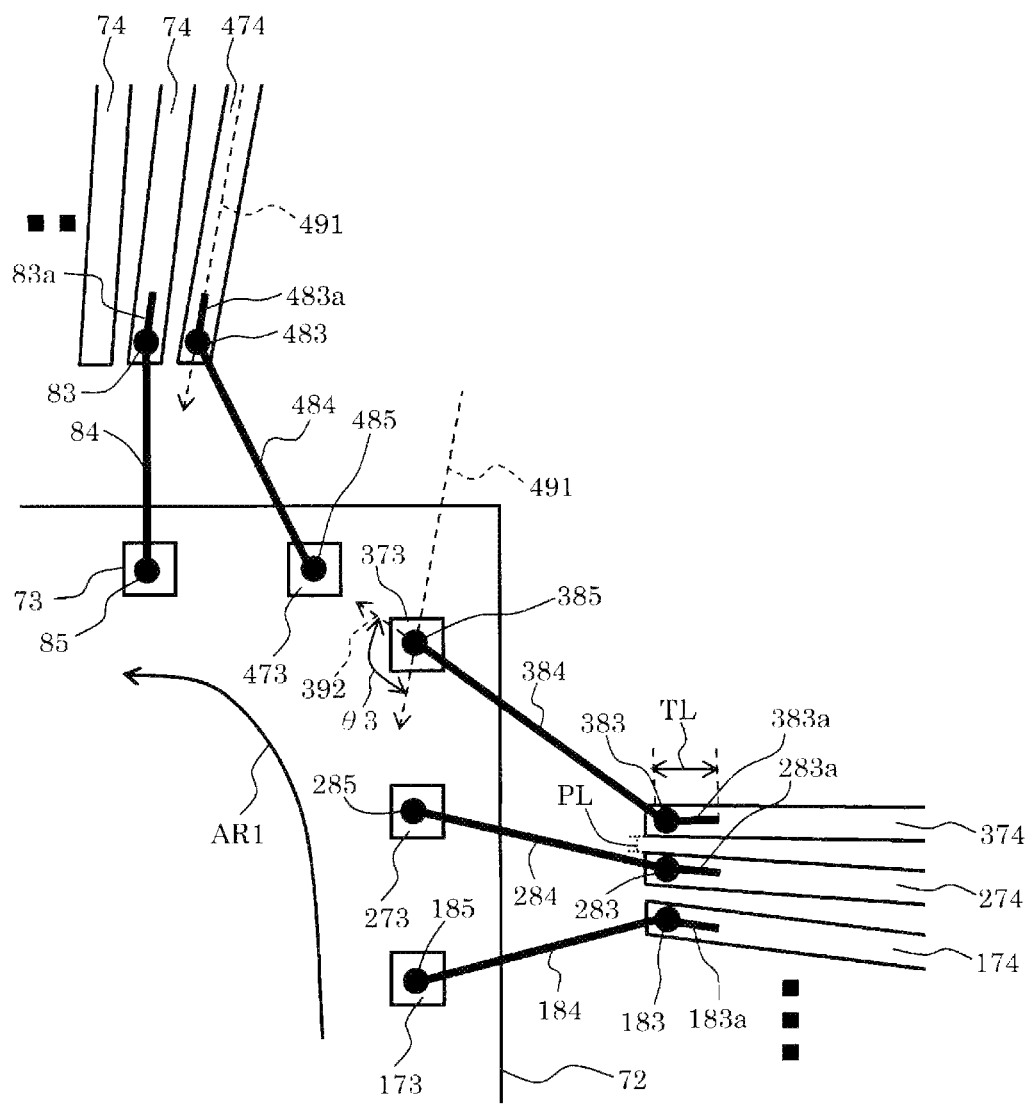
FIG. 3 is a diagram showing an example of a wire connecting a pad of a semiconductor chip with a lead of a substrate of the wire bonding apparatus of the embodiment of the present invention after wedge bonding.

Next, a process connecting the lead 74 of the substrate 71 with the pad 73 of the semiconductor chip 72 by wire through the wire bonding apparatus 10 configured as mentioned above is described. FIG. 3 is a top view showing a part of the pad 73 of the semiconductor chip 72 and a part of the lead 74 of the substrate. In each of the diagrams including FIG. 3, joining part tails 83*a*, 183*a*, 283*a*, 383*a*, and 483*a* are drawn a little longer in an exaggerated form. In the embodiment, first, a first pad 173 is connected with a first lead 174 shown in the lower right-hand corner of FIG. 3 through a first connect wire 184 (first bonding); next, a second pad 273 on the upper side of the first pad 173 is connected with a second lead 274 on the upper side of the first lead 174 through a second connect wire 284 (second bonding). In the following, each lead 74 and each pad 73 are connected sequentially in the same manner in a counter-clockwise direction (n-th bonding, n is an integer) as shown by an arrow AR1 shown in FIG. 3. In addition, in each bonding, after the wire is first bonded to the lead of the substrate, the wire is looped and second bonded to the pad of the semiconductor chip.

The control part 30 reads the control program 39, the bonding direction calculating program 33, the first wire tail extending program 34, the first tail cut program 35, the wire tail bending program 38 and the control data 40 stored in the storage part 32, and controls the bonding. As shown in FIG. 5A, at the beginning, the capillary 16 is located outside of the hole 76 of the bending station 78, the wire tail 82 extends linearly by a predetermined length from the pressing surface 16*a* at the front end of the capillary 16, and the clamper 17 is closed.

Figure 4:
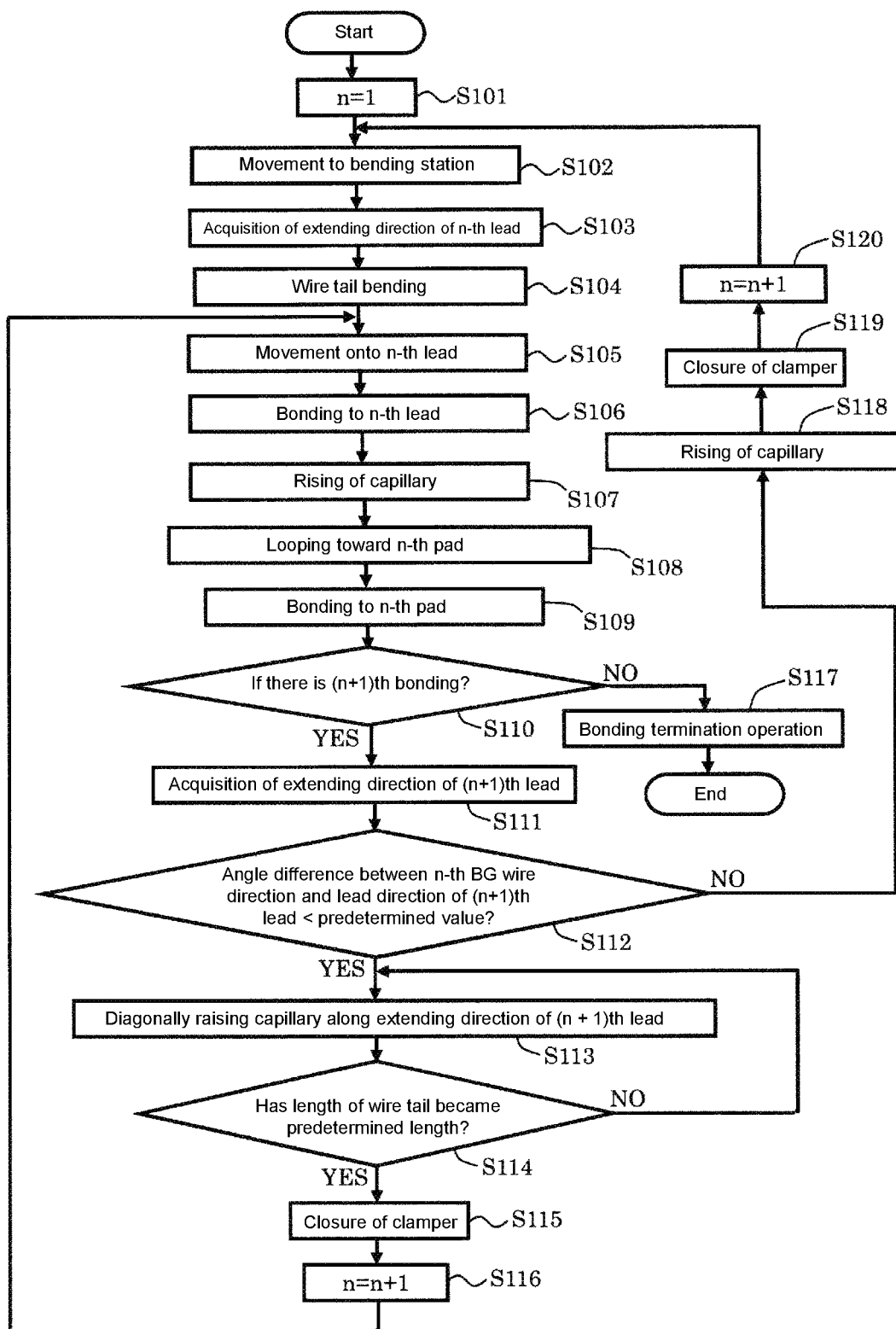
FIG. 4 is a flow chart showing operations of the wire bonding apparatus of the embodiment of the present invention.

FIG. 4 is a flow chart showing operations of the wire bonding apparatus 10 of the embodiment. First, in S101, the control part 30 initializes the integer n to 1. Next, in S102, the control part 30 functions as the wire tail bending part by running the wire tail bending program 38. The control part 30 (wire tail bending part) controls the XY stage 20, and moves, as shown in FIG. 5A, the capillary 16 relative to the bonding stage 14, making a center of the capillary 16 come directly above the hole 76 of the bending station 78. In addition, as shown in FIG. 5B, when the capillary 16 comes directly above the hole 76, the control part 30 controls the Z driving arm 23 through the Z-direction motor 19, and lowers the pressing surface 16*a* at the front end of the capillary 16 to a position slightly higher than the upper surface 75 of the bending station 78. Accordingly, the front end of the wire tail 82 linearly extending from the front end of the capillary 16 goes into the hole 76 of the bending station 78.

Because the integer n is set to 1, as shown in S103 of FIG. 4, the control part 30 acquires the extending direction of the first lead 174 to which the bonding is performed at the beginning. In the storage part 32, the inclination (extending direction) of each of the leads 74 to which the bonding is performed is stored as a part of the control data 40. The control part 30 reads and acquires the extending direction of the first lead 174 from the storage part 32. The extending direction of the first lead 174 is the lead direction of the first lead 174 recognized through the shape acquisition part described above.

Figure 6:
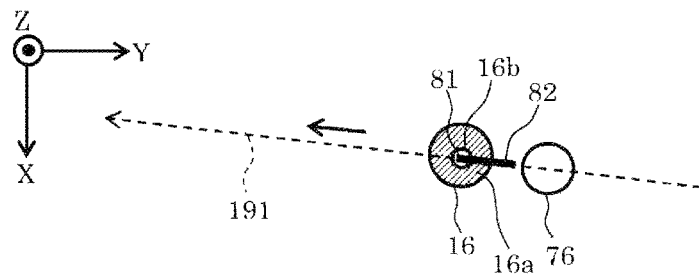
FIG. 6 is an explanatory diagram of the wire bending operation performed by the wire bonding apparatus of the embodiment of the present invention.

Next, in S104 of FIG. 4, the control part 30 (wire tail bending part) controls the XY stage 20, and moves the center of the capillary 16 horizontally along the extending direction 191 of the first lead 174 (see FIGS. 6 and 7) to the side of the pad, as shown in FIG. 6. Then, as shown in FIG. 5C, the wire tail 82 going into the hole 76 is caught on a corner (step part) of the inner surface 76*a* of the hole 76 and the upper surface 75 of the bending station 78, and bends to the lateral direction following the horizontal movement of the capillary 16. Then, if the center of the capillary 16 moves to the outside of the hole 76, the wire tail 82 will be sandwiched between the pressing surface 16*a* and the upper surface 75, and the wire tail 82 will be bent to an approximately right angle direction relative to the wire 81 which is inserted into the through-hole 16*b* of the capillary 16. Then, as shown in FIG. 6, the front end of the wire tail 82 which is bent faces the extending direction 191 of the first lead 174. In addition, when lead shape data other than the lead direction of the first lead 174 is acquired through the shape acquisition part described above, the control part 30 may be made to function as a first calculating part (also just called calculating part), calculate the extending direction of the wire tail extending from the end of the capillary based on the lead shape of the first lead 174 acquired through the shape acquisition part, and then perform the above operation.

When the bending of the wire tail 82 is done, in S105 of FIG. 4, the control part 30 controls the XY stage 20 and move the center of the capillary 16 over the first lead 174 because the integer is set to 1.

Figure 5E:
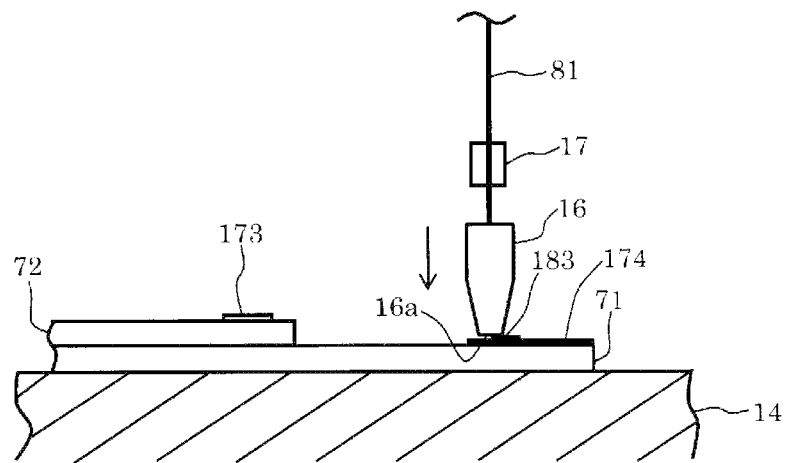
FIG. 5E is an explanatory diagram showing the wedge bonding operation to the lead of the substrate performed by the wire bonding apparatus of the embodiment of the present invention.

When the center of the capillary 16 moves over the first lead 174, in S106 of FIG. 4, the control part 30 controls the Z driving arm 23 to lower the front end of the capillary 16 over the first lead 174. In addition, as shown in FIG. 5E, the control part 30 extends from the front end of the capillary 16, presses the side surface of the wire tail which is bent along the extending direction 191 of the first lead 174 shown in FIG. 7 onto the first lead 174 through the pressing surface 16*a* of the front end of the capillary 16, and drives the ultrasonic oscillator 15 to join the wire tail 82 to the first lead 174 by the capillary 16 through wedge bonding. Through the joining, a joining part 183 is formed on the upper surface of the first lead 174, and a joining part tail 183*a* is formed in continuation to the joining part 183. The joining part tail 183*a* is formed along the extending direction 191 of the first lead 174, because the wire tail 82 at the front end of the capillary 16 is directed toward the extending direction 191 of the first lead 174.

Figure 5F:
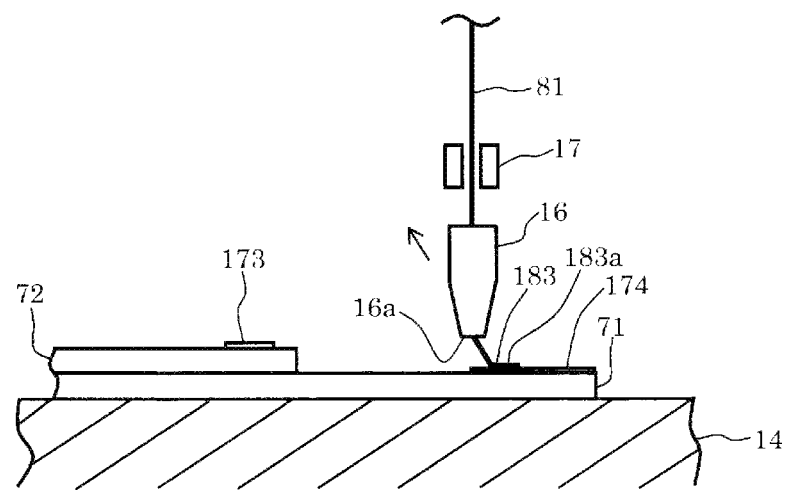
FIG. 5F is an explanatory diagram showing a raising operation of the capillary performed by the wire bonding apparatus of the embodiment of the present invention.

When the connection of the wire tail 82 to the first lead 174 comes to an end, in S107 of FIG. 4, the control part 30 controls the Z driving arm 23 and raises the front end of the capillary 16. In addition, the control part 30 function as the bonding direction calculating part by running the bonding direction calculating program 33. In the storage part 32, the position data of each of the lead 74 in the XY direction and the position data of each of the pad 73 of the semiconductor chip 72 in the XY direction are stored as a part of the control data 40. The control part 30 reads the position data of the first lead 174 in the XY direction shown in FIG. 7 and the position data of the first pad 173 in the XY direction from the storage part 32, and calculates the direction of the first bonding connecting the first lead 174 with the first pad 173 as a first wire direction 192 (the direction of a first straight line). The control part 30 raises the front end of the capillary 16, and controls the XY stage 20 to move the center of the capillary 16 in the first wire direction 192 shown in FIG. 7. In addition, at this time, the control part 30 controls the clamper opening/closing mechanism 27 and opens the clamper 17. Thus, as shown in FIG. 5F, the wire 81 is fed out from the front end of the capillary 16, and the capillary 16 is raised diagonally upward along the first wire direction 192 shown in FIG. 7.

Figure 5G:
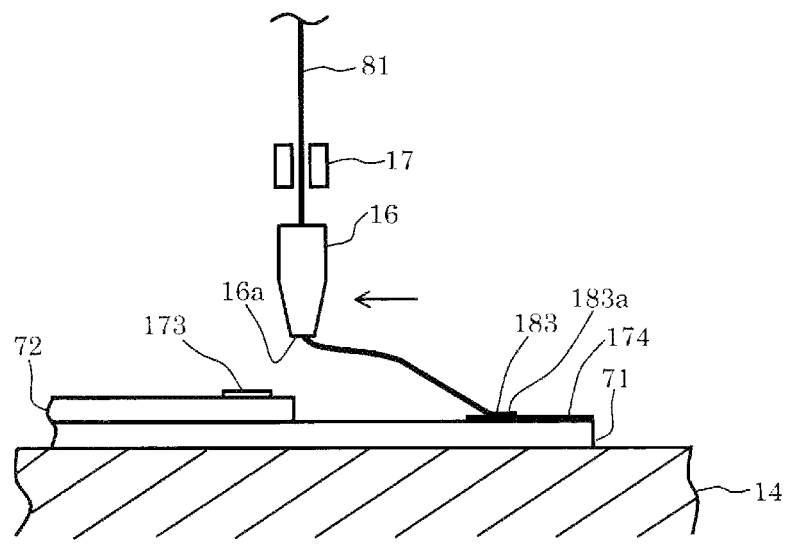
FIG. 5G is an explanatory diagram showing a looping operation from the lead of the substrate to the pad of the semiconductor chip performed by the wire bonding apparatus of the embodiment of the present invention.

Next, in S108 of FIG. 4, the control part 30 controls the Z driving arm 23 and the XY stage 20 and sets the integer n to 1, and thus the front end of the capillary 16 is moved toward the first pad 173 as shown in FIG. 5G in a loop shape when raised to a predetermined height. Through the operation, the center of the capillary 16 moves toward the first pad 173 from the joining part 183 of the first lead 174 shown in FIG. 7 along the first wire direction 192.

Figure 5H:
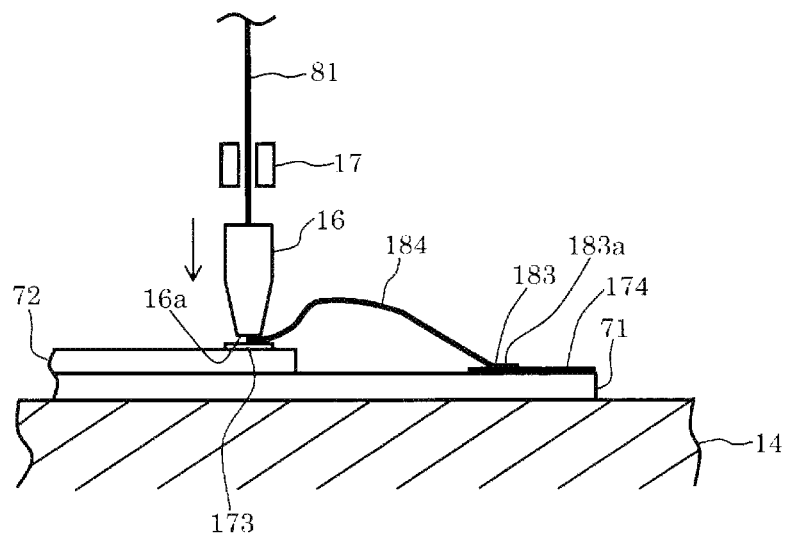
FIG. 5H is an explanatory diagram showing the wedge bonding operation to the pad of the semiconductor chip performed by the wire bonding apparatus of the embodiment of the present invention.
Figure 7:
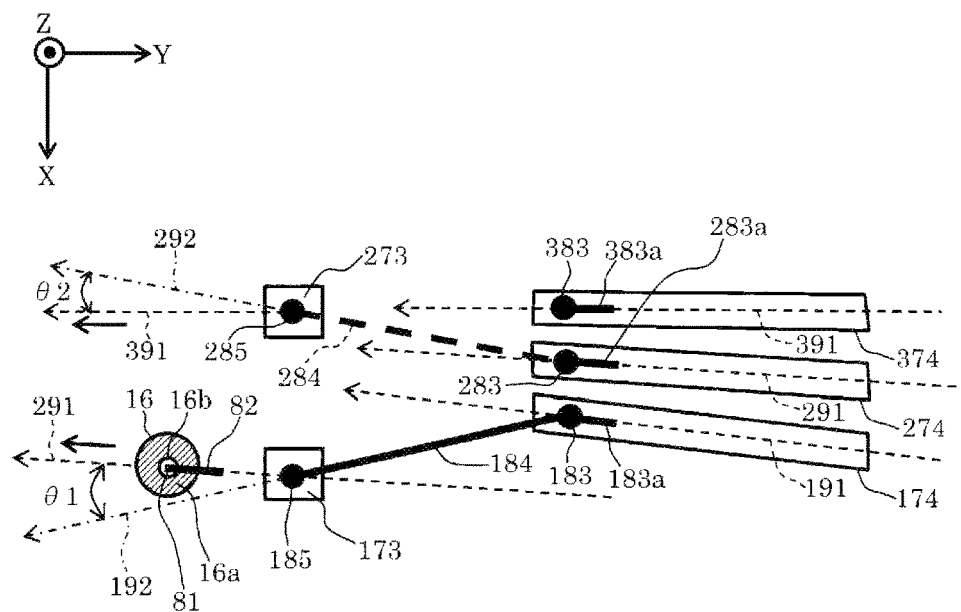
FIG. 7 is an explanatory diagram of the wire tail extending operation and the tail cut operation performed by the wire bonding apparatus of the embodiment of the present invention.

In addition, when the center of the capillary 16 moves directly above the first pad 173, in S109 of FIG. 4, the control part 30 controls the Z driving arm 23 to lower the front end of the capillary 16 onto the first pad 173. In addition, as shown in FIG. 5H, the side surface of the wire 81 extending from the front end of the capillary 16 is pressed onto the first pad 173 through the pressing surface 16*a* at the front end of the capillary 16, and the ultrasonic oscillator 15 is driven to join the side surface of the wire 81 to the first pad 173 by the capillary 16 through wedge bonding. Through the joining, a joining part 185 is formed on the upper surface of the first pad 173. In this way, if the wire 81 is joint to the first pad 173 through wedge bonding, as shown in FIG. 5H, the first lead 174 and the first pad 173 are connected, in a mountain-like loop shape, through the first connect wire 184 in a straight-line shape extending in the first wire direction 192 on the XY plane as shown in FIG. 7.

When the bonding to the first pad 173 comes to an end, in S110 of FIG. 4, the control part 30 determine if there are the lead 74 and the pad 73 to which the bonding is performed next. The integer n is set to 1, and (n+1) becomes 2. In the embodiment, because there is the second bonding connecting the second pad 273 with a second lead 274, the control part 30 determines that there is a (n+1)-th bonding shown in S110 of FIG. 4 and moves on to S111 of FIG. 4.

In S111, the control part 30 reads and acquires, from the storage part 32, an extending direction 291 (see FIG. 7) of the second lead 274 to which the bonding is performed next. The extending direction of the second lead 274 is the lead direction of the second lead 274 recognized through the shape acquisition part described above. Then, in S112, the control part 30 calculates an angle difference θ1 (also called first angle) shown in FIG. 7 between the first wire direction 192 and the extending direction 291 of the second lead 274, and draws a comparison between the angle difference θ1 and a predetermined angle. Here, the predetermined angle is an angle at which the first pad 173 or the joining part 185 on the upper surface of the first pad 173 is pulled to the wire tail 82 and is not damaged while the extending and the cut operation of the wire tail 82 of the capillary 16 front end described below is being performed, and the predetermined angle is set to 45° in the embodiment. In addition, the angle is not limited to 45°.

Figure 5I:
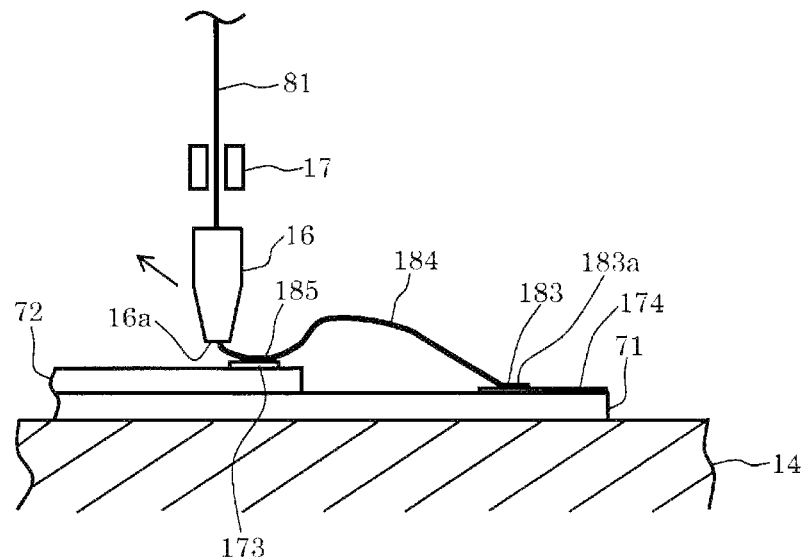
FIG. 5I is an explanatory diagram showing an wire tail extending operation performed by the wire bonding apparatus of the embodiment of the present invention.

Because the angle difference θ1 is smaller than the predetermined angle difference (45°) in S112 of FIG. 4, the operation moves on to S113. In S113, the control part 30 functions as the first wire tail extending part by running the first wire tail extending program 34. The control part 30 (the first wire tail extending part) controls the Z driving arm 23 and the XY stage 20, takes the moving direction of the front end of the capillary 16 on an XY surface as the extending direction 291 of the second lead 274 as shown in FIG. 7, and moves the front end of the capillary 16 diagonally upward as shown in FIG. 5I. Thus, the wire tail 82 extends from the front end of the capillary 16. The wire tail 82 bends by the angle θ1 at the boundary area between the wire tail 82 and the end of the joining part 185. In addition, when the lead shape data other than the lead direction of the second lead 274 is acquired through the shape acquisition part described above, the control part 30 may be made to function as the first calculating part, calculate the extending direction of the wire tail extending from the end of the capillary based on the lead shape of the second lead 274 acquired through the shape acquisition part, and then perform the above operation. In addition, the same applies to a tail cut operation below.

Figure 5J:
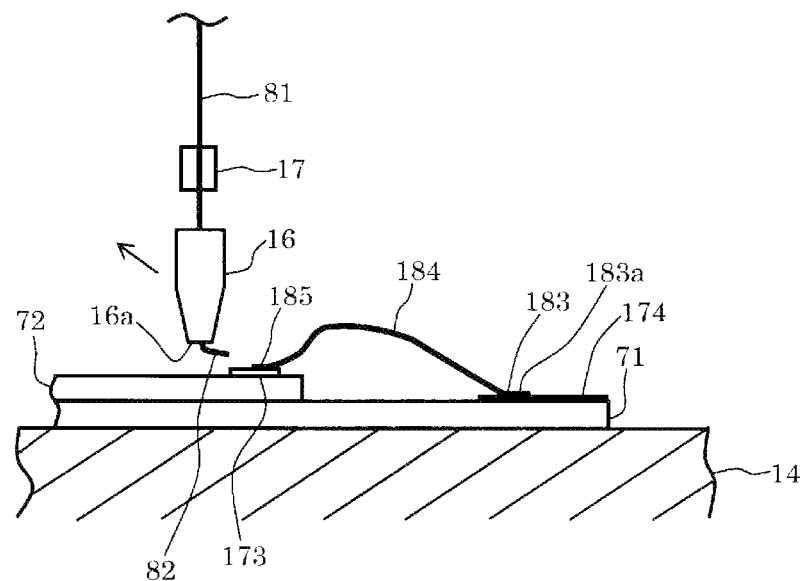
FIG. 5J is an explanatory diagram showing a tail cut operation performed by the wire bonding apparatus of the embodiment of the present invention.

Next, in S114 of FIG. 4, the control part 30 determines whether the length of the wire tail 82 of the front end of the capillary 16 becomes the predetermined length. When the length of the wire tail 82 becomes the predetermined length, in S115, the control part 30 functions as the first tail cutting part by running the first tail cut program 35. The control part 30 (the first tail cutting part) closes the clamper 17 by controlling the clamper opening/closing mechanism 27. Then, the control part 30 (the first tail cutting part) controls the Z driving arm 23 and the XY stage 20, takes the moving direction of the front end of the capillary 16 on the XY surface as the extending direction 291 of the second lead 274, and moves the front end of the capillary 16 diagonally upward. Then, as shown in FIG. 5J, the wire tail 82 is cut at the boundary having the lowest strength between the first pad 173 and the joining part 185, and the wire tail 82 is cut away from the first pad 173. At this time, as shown in FIG. 7, the wire tail 82 extending from the front end of the capillary 16 extends in the extending direction 291 of the second lead 274 in the XY surface. That is, the extending direction of the wire tail 82 extending from the end of the capillary becomes the same as the extending direction 291 of the second lead 274. In addition, the extending direction of the wire tail extending from the end of the capillary can also be called the tail extending direction or the first tail extending direction.

Figure 5K:
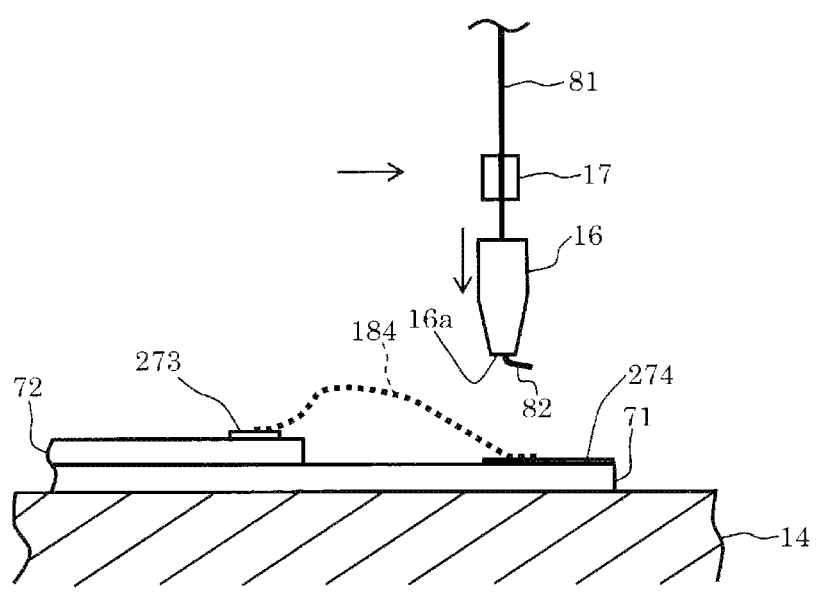
FIG. 5K is an explanatory diagram showing a moving operation to the next lead performed by the wire bonding apparatus of the embodiment of the present invention.

When the wire tail 82 is cut, in S116 of FIG. 4, the control part 30 increments the integer n by one and returns to S105. At this time, because the integer n is incremented by one and becomes 2, the control part 30 moves the center of the capillary 16 directly above the second lead 274 as shown in FIG. 5K.

When the center of the capillary 16 is moved directly above the second lead 274, the same as described earlier, in S106 of FIG. 4, the control part 30 controls the Z driving arm 23 and lowers the front end of the capillary 16 over the second lead 274. In addition, the control part 30 presses the side surface of the wire tail 82, which extends from the front end of the capillary 16 and is bent along the extending direction 291 of the second lead 274 shown in FIG. 7, onto the second lead 274 through the pressing surface 16*a* of the front end of the capillary 16, and drives the ultrasonic oscillator 15 to join the wire tail 82 to the second lead 274 by the capillary 16 through wedge bonding. Through the joining, a joining part 283 is formed on the upper surface of the second lead 274, and a joining part tail 283*a* is formed in continuation to the joining part 283. The joining part tail 283*a* is formed along the extending direction 291 of the second lead 274, because the wire tail 82 of the front end of the capillary 16 is directed toward the extending direction 291 of the second lead 274.

If the wire tail 82 is bonded to the second lead 274, in S107 to S109 of FIG. 4, the control part 30 raises the capillary 16, forms a loop toward the second pad 273, presses the side surface of the wire 81 to the second pad 273 to form a joining part 285, and connects the second lead 274 and the second pad 273 through the second connect wire 284. Then, in S110 of FIG. 4, the control part 30 determines whether there is the (n+1)th bonding. The integer n is set to 2, and (n+1) becomes 3. Because there is a third bonding connecting a third pad 373 with a third lead 374 in the embodiment, the control part 30 determines that there is the (n+1)th bonding shown in S110 of FIG. 4 and moves on to S111 of FIG. 4.

Next, in S111 of FIG. 4, the control part 30 acquires an extending direction 391 of the third lead 374, in S112, the control part 30 calculates an angle difference θ2 (the first angle) shown in FIG. 7 between a second wire direction 292 (the direction of the second bonding connecting the second pad 273 with the second lead 274 (the direction of a second straight line)) and the extending direction 391 of the third lead 374, and draws a comparison between the angle difference θ2 and the predetermined angle. As shown in FIG. 7, the angle difference θ2 is smaller than the predetermined angle difference (45°), thus the operation moves on to S113, and the control part 30 raises the capillary 16 diagonally upward along the extending direction 391 of the third lead 374. Then, after the control part 30 extends the wire tail 82 by the predetermined length in S113 and S114, the control part 30 closes the clamper 17, moves the capillary 16 along the extending direction 391 of the third lead 374, and cuts the wire tail 82 in S115. Thus, the wire tail 82 extending from the front end of the capillary 16 extends in the extending direction 391 of the third lead 374 in the XY surface. Then, in S116 of FIG. 4, n is incremented by one once again, and the operation returns to S105 of FIG. 4.

Then, following the earlier description, S105 to S109 of FIG. 4 are performed, and as shown in FIG. 3, the third lead 374 and the third pad 373 are connected through a third connect wire 384. A third joining part 383 is formed on the upper surface of the third lead 374, and a joining part tail 383a is formed in continuation to the third joining part 383. The joining part tail 383a extends along the extending direction 391 of the third lead 374.

Next, because there is a fourth bonding, S110 becomes "Yes", the operation moves on to S111, and an extending direction 491 of a fourth lead 474 is acquired. Then, in S112 of FIG. 4, an angle difference θ3 (the first angle) shown in FIG. 3 between a third wire direction 392 (the direction of the third bonding connecting the third pad 373 with the third lead 374 (the direction of a third straight line)) and the extending direction 491 of the fourth lead 474 is calculated, and a comparison is drawn between the angle difference θ3 and the predetermined angle. Here, as shown in FIG. 3, the angle difference θ3 is larger than the predetermined angle difference (45°). In this case, the operation moves on to S118, and the control part 30 controls the Z driving arm 23 to raise the capillary 16 approximately perpendicularly. Thus, the wire tail 82 extends from the front end of the capillary 16.

Next, in S119 of FIG. 4, when the length of the wire tail 82 at the front end of the capillary 16 becomes the predetermined length, the control part 30 controls the clamper opening/closing mechanism 27 to close the clamper 17. Then, the control part 30 controls the Z driving arm 23 to raise the capillary 16 approximately perpendicularly. Thus, the wire tail 82 is cut in a state of extending approximately linearly from the capillary 16.

In this way, in S112 of FIG. 4, when the angle difference between the wire direction of the previous bonding (392 in FIG. 3) and the extending direction of the next lead (491 in FIG. 3) is larger than the predetermined angle, the wire tail 82 is extended approximately linearly from the front end of the capillary 16 and is cut by implementing S118 and S119. The reason for treating in this way is that when the angle difference between the wire direction of the previous bonding and the extending direction of the next lead is large, if the capillary 16 is moved toward the extending direction of the next lead and the wire tail 82 is pulled following S113 to S115 of FIG. 4, the wire tail 82 is pulled in a state of bending at a big angle at the boundary area of the end of a joining part 385, so that there is a possibility that the pad 373 or the joining part 385 on the upper surface of the pad 373 is peeled off (damaged).

If S118 and S119 of FIG. 4 are implemented, the wire tail 82 at the front end of the capillary 16 extends approximately linearly, and do not extend in the extending direction 491 of the fourth lead 474 to which the bonding is performed next. Therefore, the capillary 16 is moved to the bending station 78, and the wire tail 82 at the front end of the capillary 16 is formed and shaped so as to extend in the extending direction 491 of the fourth lead 474. In particular, the operation is performed as follows. After S119 of FIG. 4, in S120, the control part 30 increments n by one, and n becomes 4. Then, the operation returns to S102, and the control part 30 functions as a wire tail bending part by running the wire tail bending program 38. The control part 30 (wire tail bending part) moves the capillary 16 to the bending station 78, and puts the front end of the wire tail 82 extending appropriately linearly from the front end of the capillary 16 into the hole 76 of the bending station 78 (see FIG. 5B). Then, in S103, the control part 30 acquires the extending direction 491 (see FIG. 3) of the fourth lead 474 to which the bonding is performed next. Next, in S104, the control part 30 horizontally moves the center of the capillary 16 to the side of the pad along the extending direction 491 (see FIG. 3) of the fourth lead 474. Then, as shown in FIG. 5C, the wire tail 82 put into the hole 76 is caught on a corner (step part) of the inner surface 76a of the hole 76 and the upper surface 75 of the bending station 78, and bends in the lateral direction following the horizontal movement of the capillary 16. Then, if the center of the capillary 16 moves to the outside of the hole 76, the wire tail 82 is sandwiched between the pressing surface 16a and the upper surface 75, and the wire tail 82 is bent to an approximately right angle direction relative to the wire 81 which is inserted into the through-hole of the capillary 16. Then, the wire tail 82 which is bent extends along the extending direction 491 of the fourth lead 474.

Furthermore, the same as the earlier description, the fourth lead 474 and a fourth pad 473 is connected through a fourth connect wire 484 as shown in FIG. 3 by running S105 to 109 of FIG. 4. A joining part 483 is formed on the upper surface of the fourth lead 474, and a joining part tail 483a is formed in continuation to the joining part 483. At the completion of S104, the joining part tail 483a is formed along the extending direction 491 of the fourth lead 474, because the wire tail 82 at the front end of the capillary 16 bends along the extending direction 491 of the fourth lead 474.

When the bonding is performed sequentially as described above and there is no bonding to be performed next ((n+1)th bonding) in S110 of FIG. 4, the operation moves on to S117, and the control part 30 terminates the series of treatments after the predetermined bonding termination operation is done.

Next, an operational effect of the wire bonding apparatus 10 of the embodiment described above is described.

According to the wire bonding apparatus 10 of the embodiment described above, as shown in FIG. 3, each of the joining part tails 183a, 283a, 383a, 483a ... on the upper surface of each of the leads is formed so as to extend along the extending direction of each of the leads 174, 274, 374, 474 ... of the substrate (mounted member) (the direction in which a section of the lead connected with the wire extends). Therefore, each of the joining part tails can be prevented from protruding from the upper surface of each of the leads, and the contact (short) of the joining part tails of the adjacent leads with each other can be reliably prevented.

In addition, according to the wire bonding apparatus 10 of the embodiment described above, when the angle difference of the wire direction of the previous bonding and the extending direction of the next lead (lead to which the bonding is performed next) is large, and the wire tail 82 at the front end of the capillary 16 cannot be bent in the extending direction of the next lead through the movement of the capillary 16 which has been bonded to the previous pad 73, the wire tail 82 can be bent in the extending direction of the next lead through the bending station 78 which is arranged separately.

In addition, according to the wire bonding apparatus 10 of the embodiment described above, the wedge bonding can be performed without rotating the bonding stage or the bonding tool. Therefore, the wedge bonding can be performed at a speed higher than that of the bonding apparatus using a traditional wedge tool. In addition, an easy-to-use device can be made because rotation of the bonding stage or the bonding tool is not required.

Next, other embodiments are described.

In the embodiment described above, the joining part tail 83a on the upper surface of the lead 74 is formed along the extending direction of the lead 74 constantly. Nevertheless, as another embodiment, for the substrate (mounted member) in which the distance between the leads 74 is wide, or the part of the substrate in which the distance between the leads 74 is wide, the joining part tail 83a on the upper surface of the lead 74 may be formed along the wire direction because there is no risk of contact of the joining part tails of the adjacent leads with each other. As a method through which the joining part tail 83a is formed along the wire direction, the method described in paragraph 0036 to paragraph 0070, FIG. 4, FIG. 5A to FIG. 5M, and FIG. 6 of patent literature 3 can be applied. In patent literature 3, the bonding in which the first bond is performed to the pad and the second bond is performed to the lead is performed, and it may be changed to the bonding in which the first bond is performed to the lead and the second bond is performed to the pad. The method through which the joining part tail 83a on the upper surface of the lead 74 is formed along the wire direction through the wire bonding apparatus 10 shown in FIG. 1 of the present invention is described briefly below.

Figure 8:
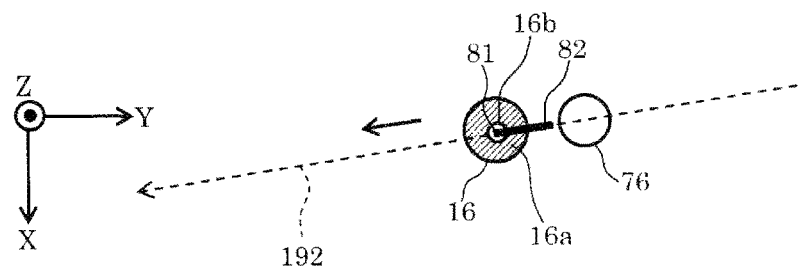
FIG. 8 is an explanatory diagram of the wire bending operation performed by a wire bonding apparatus of another embodiment of the present invention.
Figure 9:
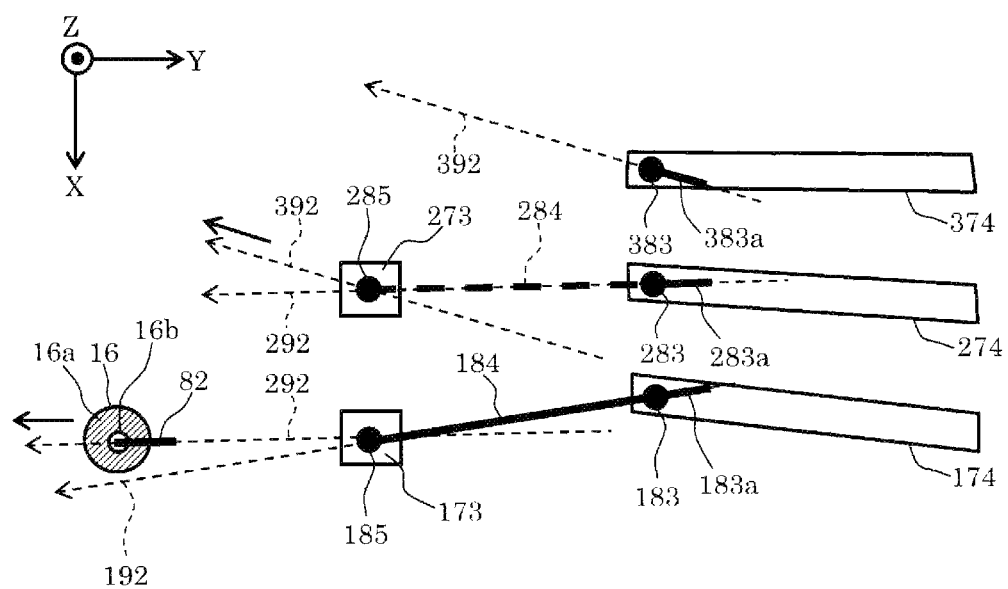
FIG. 9 is an explanatory diagram of the wire tail extending operation and the tail cut operation performed by a wire bonding apparatus of another embodiment of the present invention.

Here, as shown in FIG. 9, the method through which the joining part tails 183a and 283a are formed along the wire direction is described taking the following case as an example, wherein the first lead 174 and the first pad 173 are connected through the first connect wire 184 (the first bonding), and then the second lead 274 and the second pad 273 are connected through the second connect wire 284 (the second bonding). First, the control part 30 acquires the direction of the straight line connecting the first pad 173 with the first lead 174 (the first wire direction 192). Then, as shown in FIG. 8, the control part 30 uses the hole 76 and the upper surface of the bending station to bend the wire tail 82 extending from the front end of the capillary 16 along the first wire direction 192 through the same method as described in S104 of FIG. 4. In addition, the control part 30 may be made to function as the second calculating part as needed, calculate the direction of the straight line connecting the first lead 174 and the first pad 173 as the extending direction of the wire tail extending from the end of the capillary (the second tail extending direction), and then perform the above operation.

In addition, as shown in FIG. 9, the control part 30 first bonds the wire tail 82 to the first lead 174 through the capillary 16, loops the wire, and performs the second bond to the first pad 173. Thus, the first lead 174 and the first pad 173 are connected through the first connect wire 184. The joining part 183 is formed on the upper surface of the first lead 174, and the joining part tail 183a is formed in continuation to joining part 183. Before the first bond is performed to the first lead 174, the wire tail 82 at the front end of the capillary 16 bends in the first wire direction 192, and thereby the joining part tail 183a is formed along the first wire direction 192.

After the wire is bonded to the first pad 173 (the previous pad), the control part 30 acquires the direction of the straight line (the second wire direction 292) connecting the second lead 274 (the next lead) and the second pad 273 (the next pad). Then, the control part 30 functions as the second wire tail extending part by running the second wire tail extending program 36 in lieu of the first wire tail extending program 34. After bonding the wire to the first pad 173, the control part 30 (the second wire tail extending part) opens the clamper and raises the capillary 16 to move the capillary 16 along the second wire direction 292 by a predetermined distance and extend the wire tail 82 in the direction along the second wire direction 292 from the through-hole 16b of the capillary 16, as shown in FIG. 9. In addition, the control part 30 may be made to function as the second calculating part as needed, calculate the direction of the straight line connecting the second lead 274 and the second pad 273 as the extending direction of the wire tail extending from the end of the capillary (the second tail extending direction), and then perform the above operation. In addition, the same applies to the tail cut operation below.

Then, the control part 30 functions as the second tail cutting part by running the second tail cut program 37 in lieu of the first tail cut program 35. After extending the wire tail 82 to the front end of the capillary 16, the control part 30 (the second tail cutting part) closes the clamper, moves the capillary 16 in the direction along the second wire direction 292 and cuts the wire tail 82. After being cut, the wire tail 82 extending from the front end of the capillary 16 bends along the second wire direction 292. That is, the extending direction of the wire tail 82 extending from the end of the capillary and the second wire direction 292 become the same. In addition, at this time, the extending direction of the wire tail extending from the end of the capillary can also be called the second tail extending direction.

Next, as shown in FIG. 9, the control part 30 first bonds the wire tail 82 to the second lead 274 through the capillary 16, loops the wire, and performs the second bond to the second pad 273. Thus, the second lead 274 and the second pad 273 are connected through the second connect wire 284. The joining part 283 is formed on the upper surface of the second lead 274, and the joining part tail 283a is formed in continuation to the joining part 283. Before the first bond is performed to the second lead 274, the wire tail 82 at the front end of the capillary 16 bends to the second wire direction 292, and thereby the joining part tail 283a is formed along the second wire direction 292. In this way, the joining part tail on the upper surface of each of the leads is formed along the wire direction by the joining between the lead and the pad through the wire. The method of forming the joining part tail along the wire direction is described above.

Moreover, as still another embodiment, the wire bonding apparatus 10 may change the extending direction of the joining part tail selectively, based on the length of the joining part and the joining part tail and the distance between the leads of the substrate. For example, as shown in FIG. 3, when a length TL (also called the first length) combining the joining part tail (joining part tail 383a in FIG. 3) with the joining part (joining part 383 in FIG. 3) in the lead of the substrate is longer than a minimum distance PL between the leads, there is a possibility that the adjacent joining part tails (the joining part tail 383a, 283a in FIG. 3) come into contact with each other. Therefore, in this case, the control is performed following the flow shown in FIG. 4, the control part 30 is made to function as the first wire tail extending part and the first tail cutting part, and the extending direction of the joining part tail is matched with the extending direction of the lead. Meanwhile, when the length TL combining the joining part tail with the joining part becomes equal to or shorter than the minimum distance PL between the leads, the control described in FIGS. 8 and 9 is performed, the control part 30 is made to function as the second wire tail extending part and the second tail cutting part, and the extending direction of the joining part tail is matched with the wire direction. In this way, the extending direction of the joining part tail can be optimized.

In addition, an operator may use an input device (not shown) to set the extending direction of the joining part tail individually for each lead of the substrate. In this case, setting information is stored previously as a part of the control data 40 in the storage part 32. The wire bonding apparatus 10 reads the setting information from the storage part 32, and changes the extending direction of the joining part tail for each lead of the substrate following the setting information during the bonding.

What is claimed is:

1. A wire bonding apparatus which connects a lead of a mounted member with an electrode of a semiconductor die through a wire, comprising:
   a capillary through which the wire is inserted,
   a processor configured as a shape acquisition part which at least acquires a shape of a lead to which the wire is connected next,
   a calculating part which calculates an extending direction of a wire tail extending from an end of the capillary based on the shape of the lead to which the wire is connected next, and
   a cutting part which moves the capillary in the extending direction and cuts the wire to form the wire tail after the wire is connected between a lead currently being bonded and an electrode; and
   a moving mechanism which connected with the capillary to move the capillary to cut the wire tail extending from the end of the capillary to be extended in the extending direction.

2. The wire bonding apparatus according to claim 1, wherein
   the extending direction of the wire tail is a tail extending direction,
   the shape acquisition part recognizes a lead direction which is a direction in which a section connected with the wire on the lead to which the wire is connected next extends, and
   the cutting part forms the wire tail in a manner that the tail extending direction becomes the same direction as the lead direction.

3. The wire bonding apparatus according to claim 1, wherein
   the extending direction of the wire tail is a tail extending direction, and
   the wire bonding apparatus further comprises: a bending station which has a step part catching the wire tail extending from a front end of the capillary, and
   the processor further configured as a bending part which moves the capillary to the bending station and bends the wire tail in the tail extending direction after arranging the wire tail to a position along the step part.

4. The wire bonding apparatus according to claim 3, wherein
   a first angle, which is an angle formed by the direction of the wire connecting the lead with the electrode and the lead direction which is a direction in which a section connected with the wire on the lead to which the wire is connected next extends, is acquired,
   when the first angle is smaller than a predetermined angle, the wire tail is formed through the cutting part, and
   when the first angle is equal to or greater than the predetermined angle, the wire tail is formed through the bending part.

5. The wire bonding apparatus according to claim 1, wherein
   the calculating part is a first calculating part,
   the cutting part is a first cutting part,
   the extending direction of the wire tail is a first tail extending direction, and
   the processor further configured as: a second calculating part, which calculates a direction of a straight line connecting the lead to which the wire is connected next and the electrode, as a second tail extending direction which is the extending direction of the wire tail extending from the end of the capillary, and
   a second cutting part, which moves the capillary in the second tail extending direction and cuts the wire to form the wire tail after the lead is connected with the electrode through the wire.

6. The wire bonding apparatus according to claim 5, wherein
   a first length which combines a joining part formed on the lead and a joining part tail protruding from the joining part is acquired,
   when the first length becomes longer than a minimum distance between the leads of the mounted member, the wire tail is formed through the first cutting part, and
   when the first length is equal to or shorter than the minimum distance, the wire tail is formed through the second cutting part.

* * * * *